(12) United States Patent
Ilic et al.

(10) Patent No.: US 7,105,075 B2
(45) Date of Patent: Sep. 12, 2006

(54) DC POWER SUPPLY UTILIZING REAL TIME ESTIMATION OF DYNAMIC IMPEDANCE

(75) Inventors: Milan Ilic, Fort Collins, CO (US); Kalyan N. C. Siddabattula, Fort Collins, CO (US); Gerald C. Roop, Jr., Fort Collins, CO (US); David J. Christie, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 84 days.

(21) Appl. No.: 10/884,027

(22) Filed: Jul. 2, 2004

(65) Prior Publication Data
US 2006/0012308 A1   Jan. 19, 2006

(51) Int. Cl.
C23F 1/02   (2006.01)
C23C 16/00  (2006.01)

(52) U.S. Cl. .......................... 156/345.28; 156/345.24; 118/723 E; 118/723 I

(58) Field of Classification Search .................... None
See application file for complete search history.

(56) References Cited

U.S. PATENT DOCUMENTS 5,543,689 A   8/1996   Ohta et al. .............. 315/111.21
6,291,999 B1 *  9/2001   Nishimori et al. ........... 324/464
2002/0185227 A1 * 12/2002  MacGearailt .......... 156/345.43
2004/0135590 A1 *  7/2004   Quon ......................... 324/713
2004/0188021 A1 *  9/2004   Mitrovic ................ 156/345.52

\* cited by examiner

Primary Examiner—Tuyet Thi Vo

(57) ABSTRACT

There is provided by this invention an apparatus and method for controlling a dc magnetron plasma processing system that automatically adjusts the control signal to the power supply based upon the dynamic impedance of the load to control the output power to the plasma. The output voltage and the output current of the power supply that supplies power to the plasma is sampled over at a sampling frequency at least four to five times higher than the switching frequency and the dynamic impedance of the plasma is calculated based upon the sampled voltage and current from the algorithm $$R_{plasma} = \frac{\Delta V_n}{\Delta I_n}$$

wherein $\Delta V_n$ and $\Delta I_n$ is the maximum difference among samples on one switching cycle. If the dynamic impedance seen is negative in nature then the control signal is compensated accordingly.

2 Claims, 7 Drawing Sheets

DC POWER SUPPLY UTILIZING REAL TIME ESTIMATION OF DYNAMIC IMPEDANCE

BACKGROUND OF THE INVENTION

1. Field of the Invention

This invention relates generally to any controller for a power supply that utilizes a compensator to shape the response of the control loop to external disturbances, and more particularly to a control means for calculating the dynamic impedance of a DC magnetron based process.

2. Brief Description of the Prior Art

In plasma processing for the manufacture of thin films for integrated circuits, flat panel displays, glass coatings, etc a fast controller is required to effectively control the power delivered to a wide range of plasma processes. Controllers are designed accounting for the control to output transfer function of the power supply. The transfer function of the power supply depends on the dynamic impedance of the load. The primary function of a controller for a power supply is to achieve and maintain any commanded control signal. The controller is designed accounting for the control to output, and line to output transfer functions of the power supply. The dependence of the controller on load impedance may be in the form of DC gain, or the location of a pole or a zero in the transfer function of the power supply. Any change in the output impedance can significantly influence the performance of the control loop and sometimes even catastrophically by making a previously stable system unstable. As shown in FIG. 1 the dynamic impedance is positive for curves A and B and negative for curve C. The voltage and resistance are a function of the operating point and can change with time. FIG. 2 illustrates how depending on the process and plasma characteristics the plasma load can be modeled as a voltage source in series with a resistance. In the cases where variations in the transfer function due to a change in the dynamic impedance may be limited to the DC gain and could be easily compensated with analog circuitry or digital gain blocks, it is performed by a priori analysis of the transfer functions and implementing lookup tables for different load conditions.

Some controllers utilize DC current and the DC voltage to calculate the DC impedance of the plasma. However, this method has a disadvantage, since it assumes that the plasma represents a load that is only an impedance in nature. In the case of model plasma as shown in FIG. 2 then an approach is to use an empirical value of the plasma voltage and subtract this from the DC voltage and then use this to calculate the actual dynamic impedance of the plasma. This approach has a disadvantage because there are wide ranges of internal voltages that even the same plasma can exhibit.

For instance, U.S. Pat. No. 5,543,689 issued to Ryusuke Ohta et al discloses a high frequency power source wherein the controller has a memory for storing initial plasma characteristic data and plasma gain, a comparable operation section for calculating control target data from initial plasma characteristic data and detected power data and computing the control gain data from the difference between the control target data and the power control signal data. The control target data is derived by subtracting the initial plasma data from the detected plasma data. However, the process described relies upon an alarm for manual adjustment of the control signal. Such a system has a slow response time and may cause the process to shut down before correction can be made.

These types of control schemes are undesirable because 1) estimation of the plasma resistance is extremely difficult; 2) implementation of the compensation is limited to the DC gain; 3) they are not continuous and dependence may not be monotonic with respect to the load impedance; and 4) the variation in the poles and zeros of the transfer function with the load impedance may still degrade the performance of the system and in some instances may also cause the system to go unstable. Also, faster loop speeds require ability to compensate for load and create transfer functions to create a fairly wide-band system.

It would be desirable if there were provided a controller for a DC power supply that utilized a fast control loop which works for a wide range of plasma processes. It would also be desirable if there were provided method of control which enables adaptive and non-linear control by estimating dynamic impedance of the load.

SUMMARY OF THE INVENTION

There is provided by this invention a controller for a power supply such as a power supply for a DC magnetron process system that utilizes an analog to digital converter (ADC) in combination with a digital microprocessor to estimate the dynamic impedance of the plasma. An automatic control loop maintains the control signal for the power supply by sampling the output voltage and current of the power supply to correct for differences between the output and a predetermined control signal.

BRIEF DESCRIPTION OF THE PREFERRED EMBODIMENTS

Figure 1:
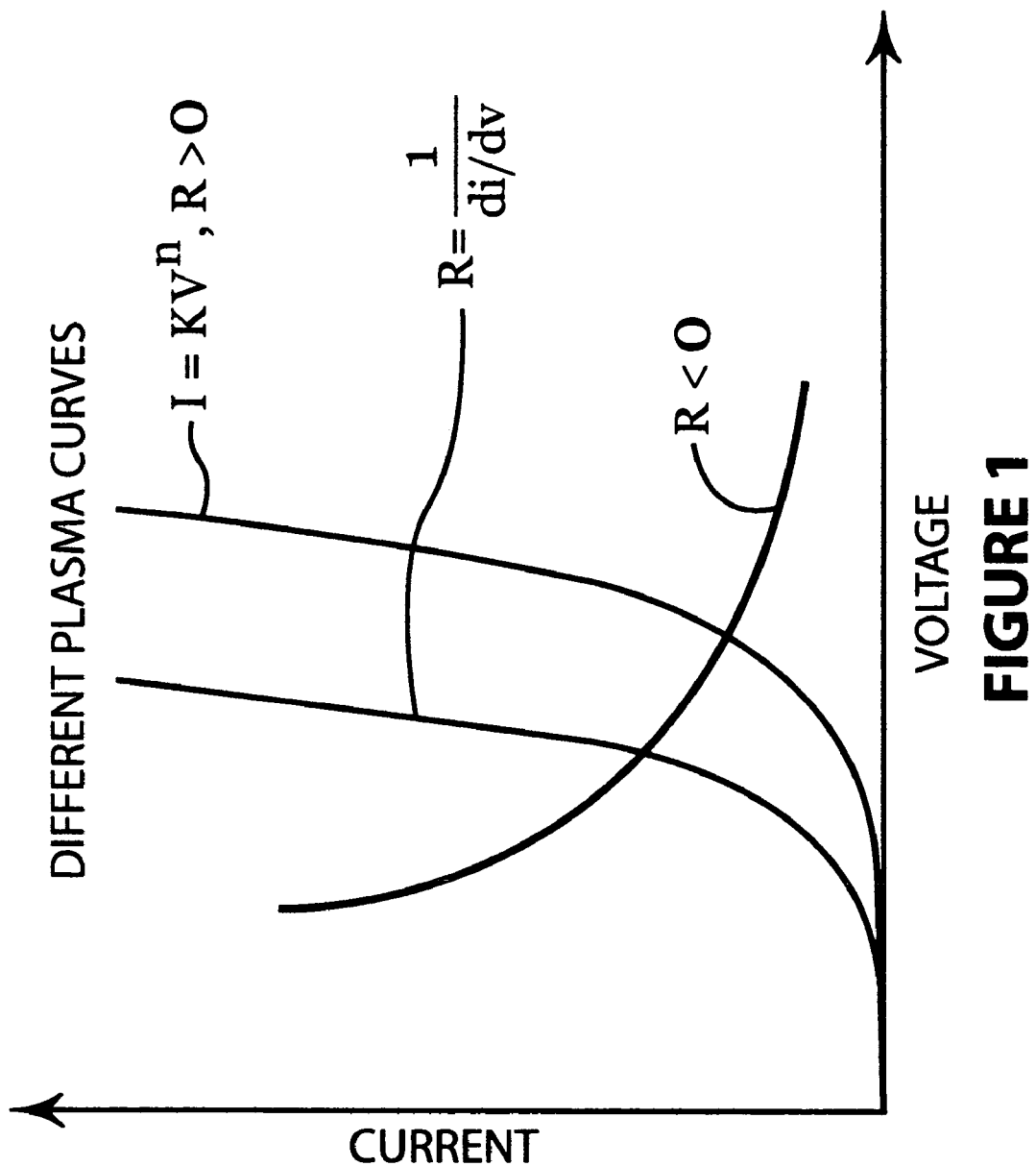
FIG. 1 illustrates the V-I curves for different plasma loads.
Figure 2:
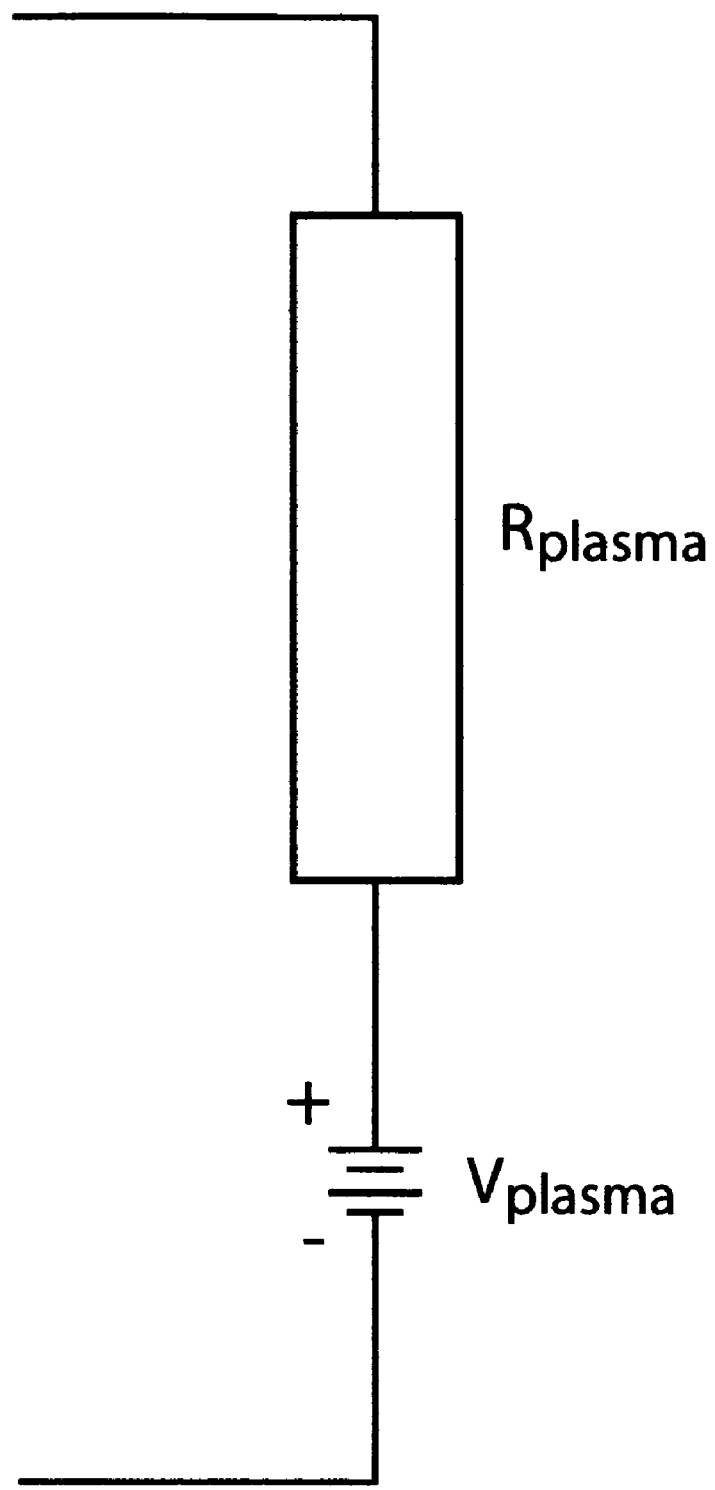
FIG. 2 illustrates schematically a model of a plasma load.
Figure 3:
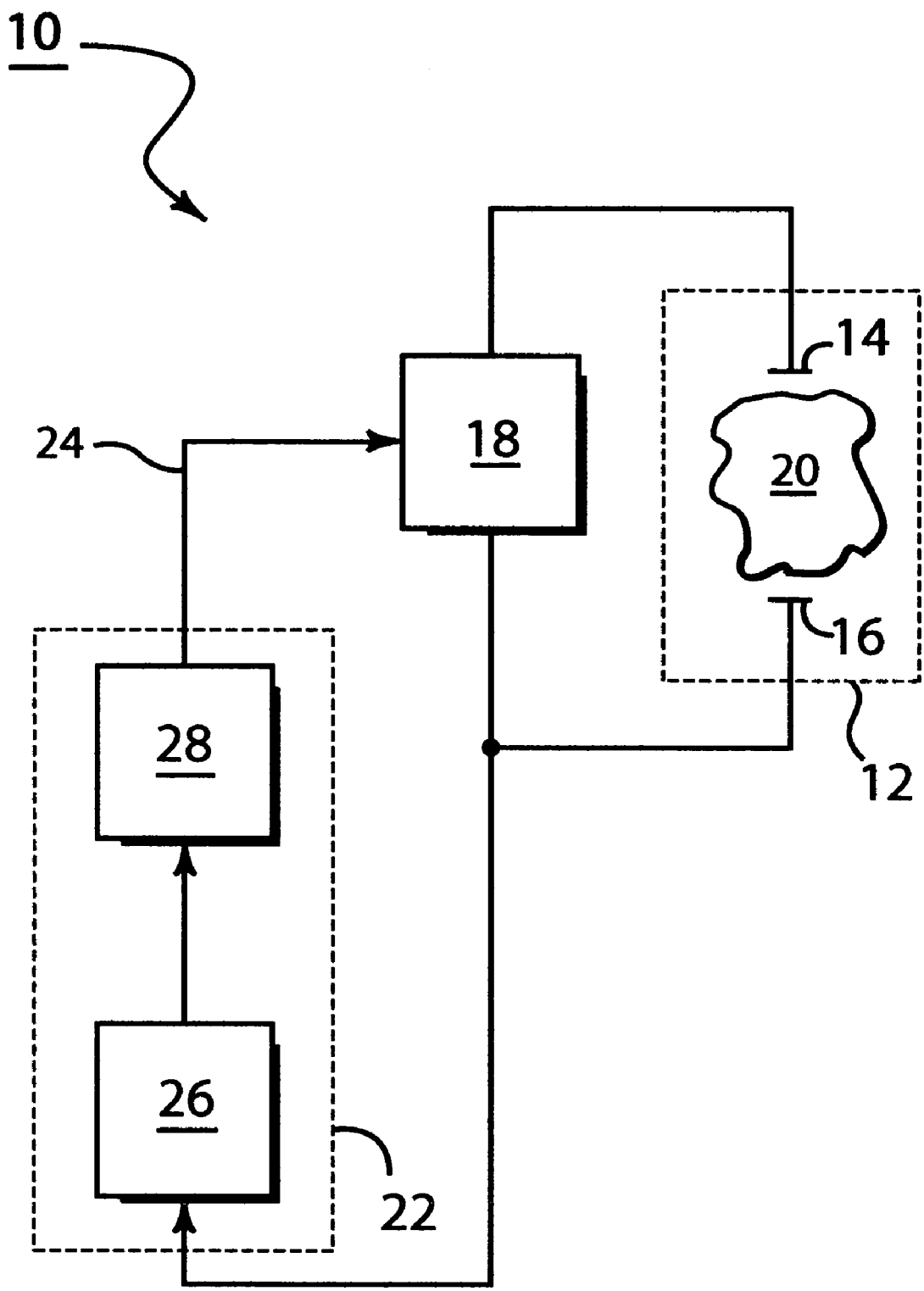
FIG. 3 illustrates a block diagram of the controller and power supply incorporating the principles of this invention.

Referring to FIG. 3 there is shown a plasma processing system 10 such as a DC magnetron processing system that incorporates the principles of this invention. A plasma chamber 12 has contained therein electrodes 14 and 16. A power supply 18 supplies a voltage to the electrodes 14 and 16 in order to ignite plasma 20 in a reactive gas (not shown). Particles from the plasma are disposed to deposit a thin film on a substrate (not shown) in the chamber. To compensate for changes in the output of the power supply 18 a controller 22 automatically adjusts the control signal 24 to the power supply based upon the change of the dynamic impedance of the plasma 20. The controller is generally comprised of an analog to digital converter 26 and microprocessor 28. The A/D converter samples the output voltage and current of the power supply and the values are inputted to the microprocessor which makes a real time estimation of the dynamic impedance of the plasma and sends a control signal 24 to the power supply to make output adjustments as necessary.

Figure 4:
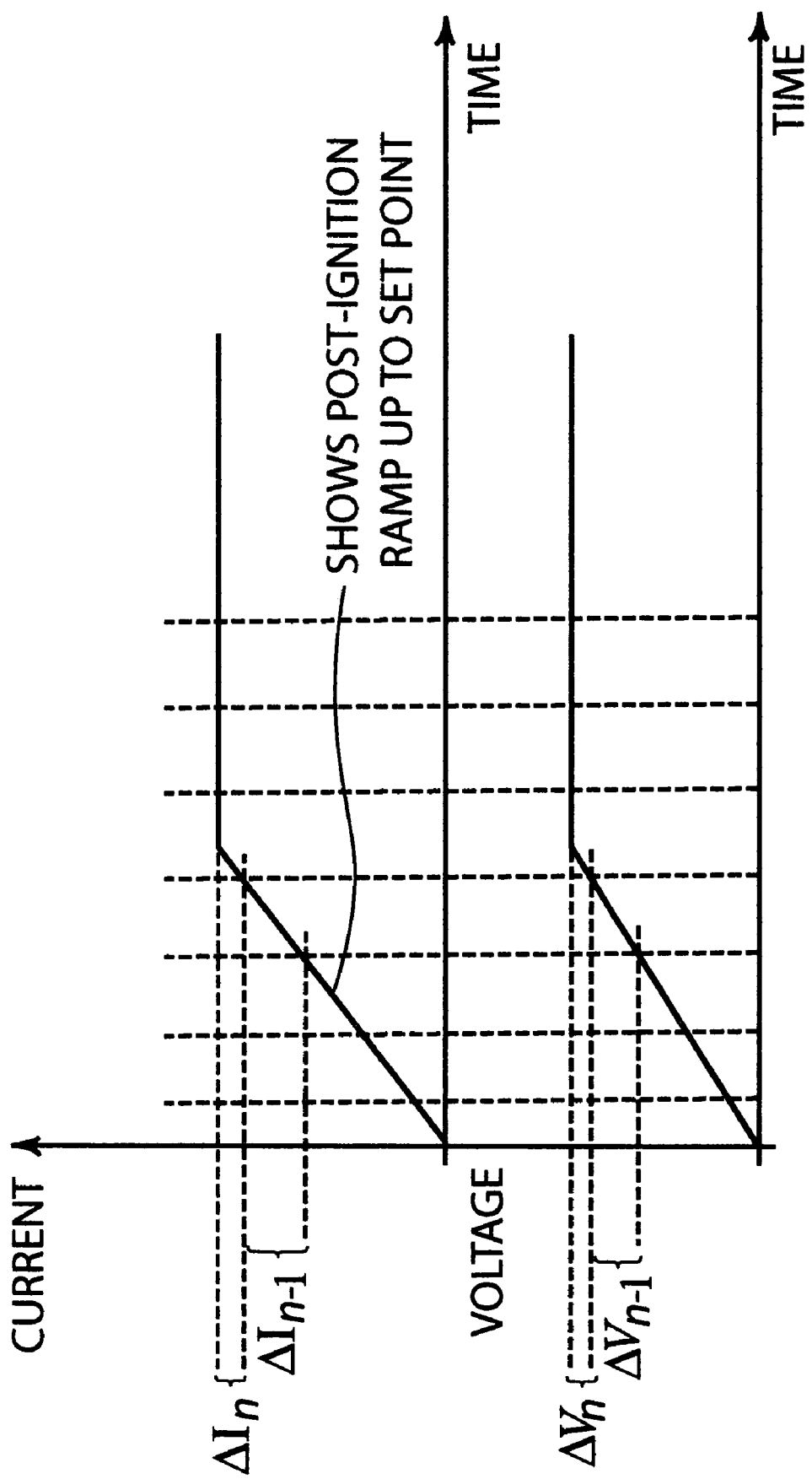
FIG. 4 illustrates waveforms for real time estimation of the dynamic impedance from transient voltage and current waveforms.

FIG. 4 illustrates the typical transient to control signal post-plasma-ignition for the following algorithm:

$$R_{plasma} = \frac{\Delta V_{n-1}}{\Delta I_{n-1}}$$

Where $\Delta V_{n-1}$ represents the moving increment in plasma voltage over a fixed number of samples based upon the sampling frequency. $\Delta I_{n-1}$ represents the same value for the plasma current. This occurs when the absolute value of the increments in voltage and current are lower than the threshold. A predetermined threshold is chosen to estimate when the plasma reaches steady state. This threshold is chosen considering the sampling frequency and the power system dynamics. This enables the calculation of the dynamic impedance when the plasma is just about to reach the set point. It is to be noted that this algorithm enables the controller to estimate if the dynamic impedance being seen by the power supply is negative in nature, and compensate appropriately for negative impedance.

Figure 5:
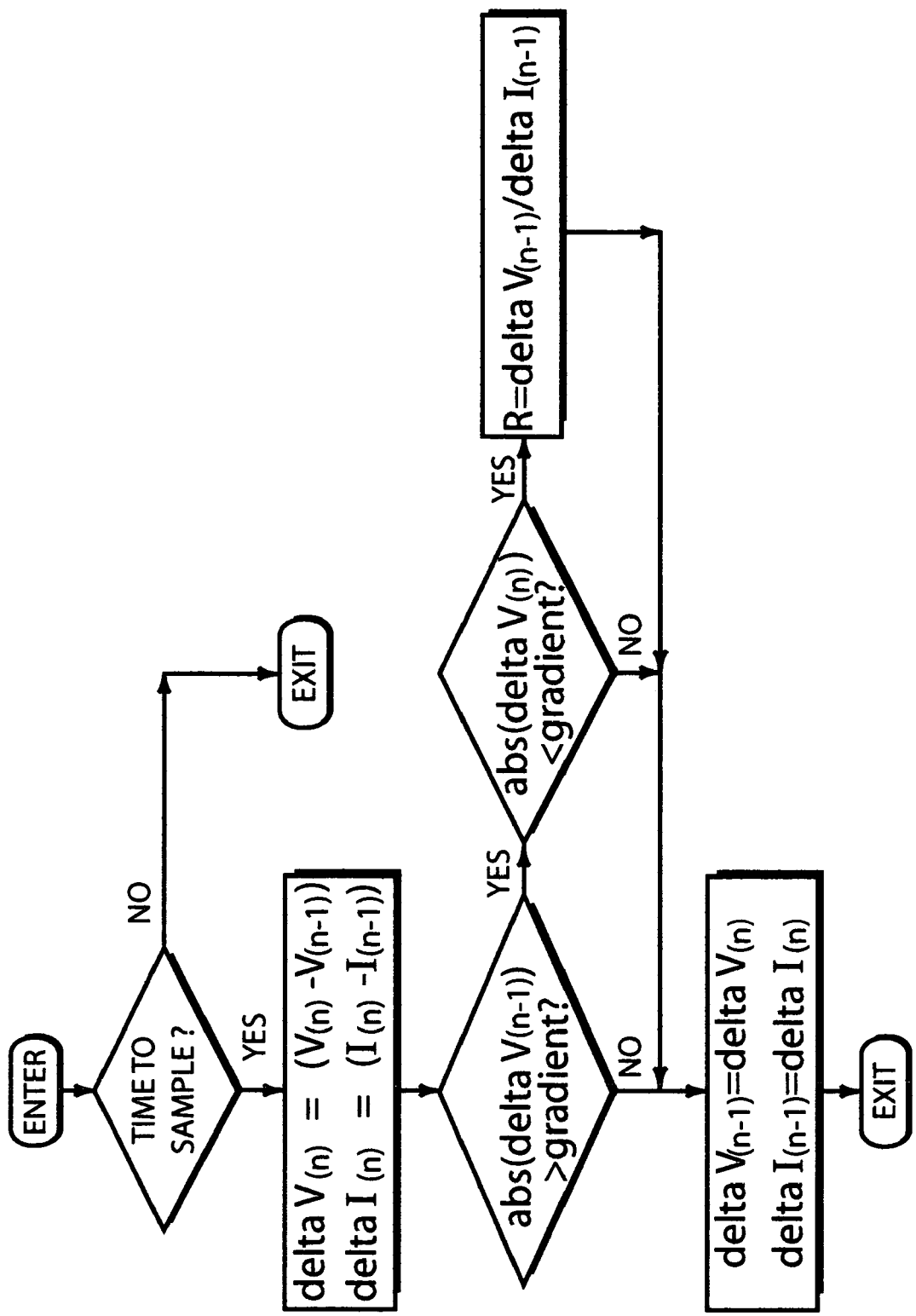
FIG. 5 illustrates a flow chart for the algorithm used for estimation of dynamic impedance.

FIG. 5 illustrates the flow chart used for estimating the dynamic impedance of the plasma. In the first step, depending on the sampling frequency, the A/D converter samples both the output voltage and current of the power supply. This method calculates the dynamic impedance prior to the plasma reaching the set point and not while the plasma is at set point. In order to measure the impedance at set point another digital measurement system utilizes the A/D converter sampling at a frequency higher than the power supply switching frequency ripple seen on the plasma current and voltage, which is usually the switching frequency or a multiple of it. This data can be used to estimate the dynamic impedance of the plasma. It is specifically possible to determine whether the dynamic impedance is positive or negative with this algorithm.

Figure 6:
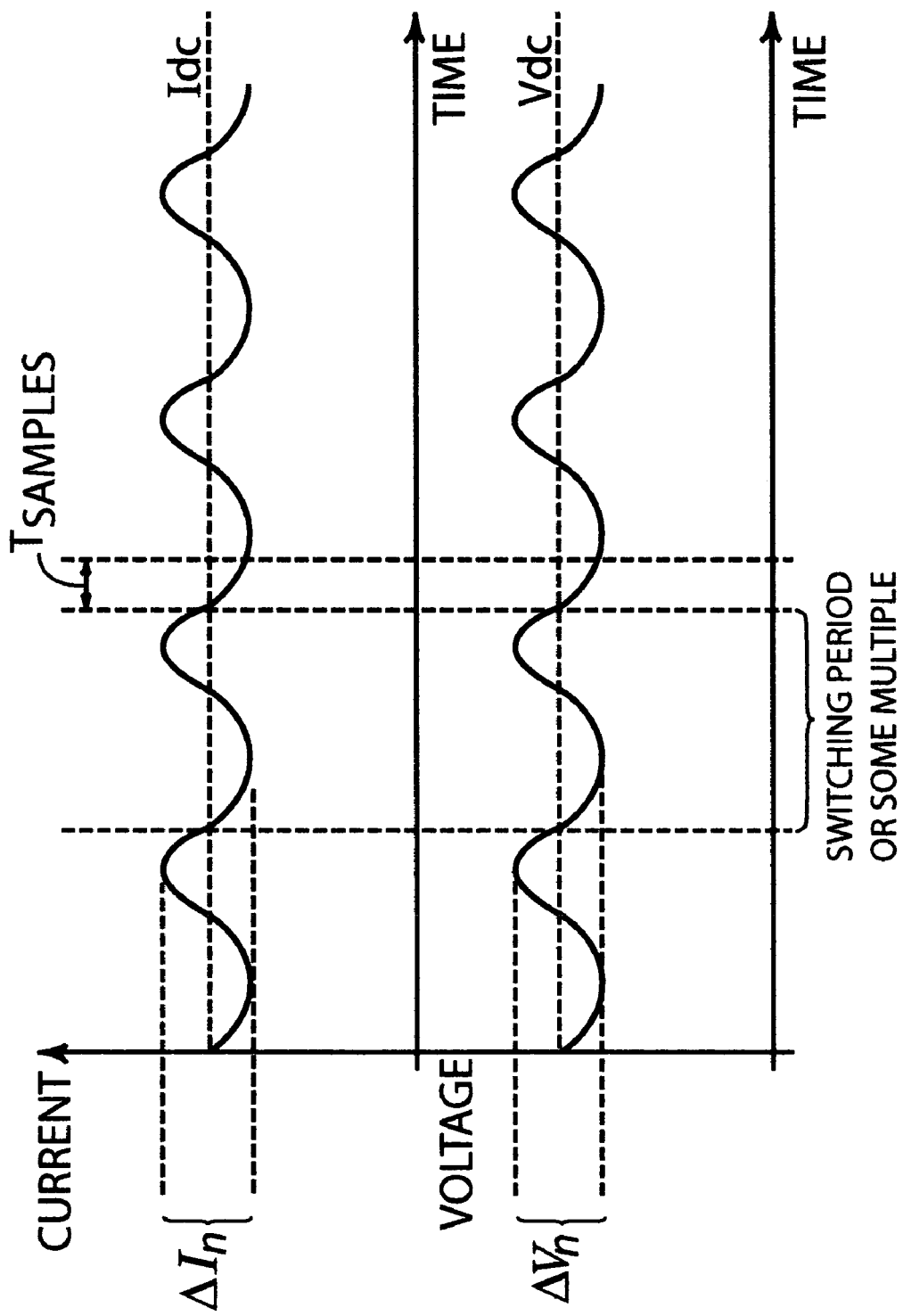
FIG. 6 illustrates waveforms for estimation of the dynamic impedance from the switching ripple.

FIG. 6 illustrates the estimation of the dynamic impedance from the switching ripple. In order to accomplish this task the sampling frequency is usually on the order of four or five times the ripple on the voltage and current. Then the maximum and minimum values of the voltage/current within an integral number of switching periods are estimated and the difference between them gives $\Delta V_n$ and $\Delta I_n$.

It is then possible to look for the maximum change in either the voltage or current and then use the change in the other parameter (current or voltage respectively) during the same time interval to calculate the dynamic impedance of the plasma.

$$R_{plasma} = \frac{\Delta V_n}{\Delta I_n}$$

Figure 7:
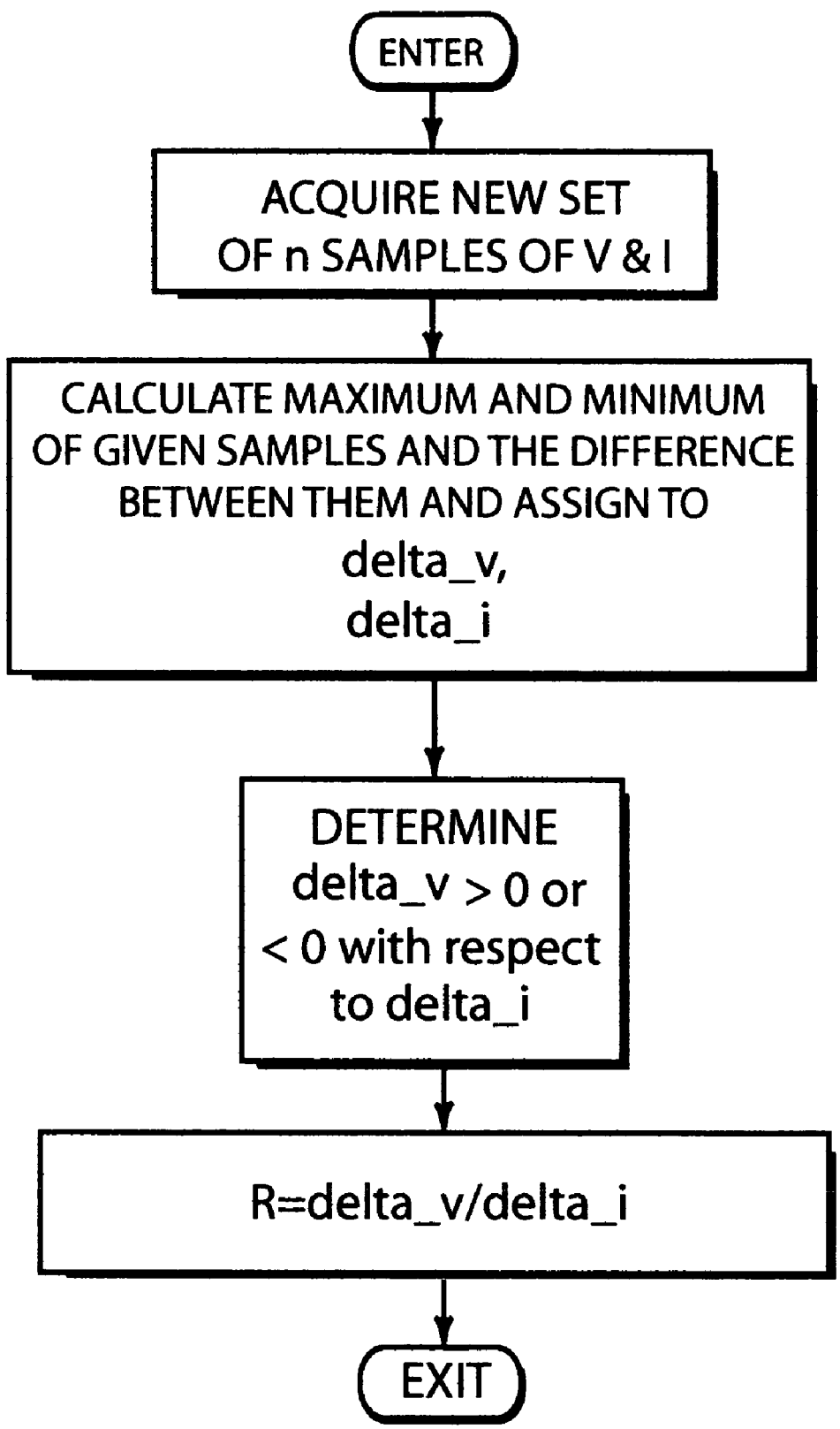
FIG. 7 illustrates a flow chart for the algorithm used for estimation of the dynamic impedance from the switching ripple.

FIG. 7 illustrates the flow chart for calculating the dynamic impedance from the switching ripple. The A/D converter acquires a new set of n samples for voltage and current. The microprocessor calculates the maximum and minimum of the given samples and the difference between them and assigns to delta V and delta I. The dynamic impedance is then calculated from these values. This algorithm specifically determines whether the dynamic impedance is negative or positive.

It must be noted here that the impedances calculated with the two methods are at two different frequencies. The one measured with the transient set up is at a frequency much closer to the control loop bandwidth. The one calculated using the switching frequency ripple is at a much higher frequency than the control loop bandwidth. However, the impedance estimated using the switching ripple gives insight into the high-frequency performance of the plasma, and is useful for determining the fast dynamics of the plasma.

Although there is illustrated and described specific structure and details of operation, it is clearly understood that the same were merely for purposes of illustration and that changes and modifications may be readily made therein by those skilled in the art without departing from the spirit and the scope of this invention.

We claim:

1. A method of controlling a dc magnetron plasma processing system consisting of the steps of:
   sampling the output voltage and the output current of the power supply that supplies power to the plasma over a number of samples based upon a sampling frequency;
   calculating the dynamic impedance of the plasma based upon the sampled voltage and current from the algorithm $$R_{plasma} = \frac{\Delta V_{n-1}}{\Delta I_{n-1}}$$

whereby $\Delta V_{n-1}$ and $\Delta I_{n-1}$ are calculated from samples just before plasma gets to the steady-state condition;
   estimate if the dynamic impedance seen is negative in nature and compensate accordingly
   and sending a control signal to adjust the control signal of the power supply based upon the dynamic impedance of the plasma.

2. A method of controlling a dc magnetron plasma processing system consisting of the steps of:
   sampling the output voltage and the output current of the power supply that supplies power to the plasma at a sampling frequency at least four to five times higher than the switching frequency;
   calculating the dynamic impedance of the plasma based upon the sampled voltage and current from the algorithm $$R_{plasma} = \frac{\Delta V_n}{\Delta I_n}$$

wherein $\Delta V_n$ and $\Delta I_n$ are the maximum differences among samples on one switching cycle;
   estimating from this method if the dynamic impedance is negative and then compensating accordingly and sending a control signal to adjust the control signal of the power supply based upon the dynamic impedance of the plasma.

* * * * *